(12) United States Patent
Kagawa

(10) Patent No.: US 6,222,808 B1
(45) Date of Patent: Apr. 24, 2001

(54) OPTICAL INFORMATION REPRODUCING METHOD AND APPARATUS

(75) Inventor: Masaki Kagawa, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/982,767

(22) Filed: Dec. 2, 1997

(30) Foreign Application Priority Data

Dec. 6, 1996 (JP) ...................................... 8-326726

(51) Int. Cl.$^7$ ...................................... G11B 7/00
(52) U.S. Cl. .................... 369/59.18; 369/59.22; 369/47.35
(58) Field of Search ................ 369/47, 48, 54, 369/58, 60, 124, 59

(56) References Cited

U.S. PATENT DOCUMENTS

| | | | |
|---|---|---|---|
| 5,440,572 | 8/1995 | Kitaori | 371/43 |
| 5,506,827 | 4/1996 | Tobita | 369/59 |
| 5,600,664 * | 2/1997 | Hayashi | 369/60 |
| 5,602,858 * | 2/1997 | Kitaori | 369/65 |
| 5,661,709 * | 8/1997 | Takagi et al. | 369/59 |
| 5,675,569 * | 10/1997 | Yamaguchi et al. | 369/59 |
| 5,729,517 * | 3/1998 | Fujiwara et al. | 369/59 |
| 5,742,576 * | 4/1998 | Hayashi et al. | 369/59 |
| 5,761,171 * | 6/1998 | Tobita | 369/59 |
| 5,764,608 * | 6/1998 | Satomura | 369/59 |

FOREIGN PATENT DOCUMENTS 0 652 559   5/1995  (EP) .

OTHER PUBLICATIONS

Patent Abstracts of Japan vol. 017, No. 354 (P–1567), JP 05 047112 A (Sony Corp), Feb. 26, 1993.

Tobita M. et al: "Viterbi Detection of Partial Response on a Magneto–Optical Recording Channel" Proceedings of the SPIE, vol. 1663, No. 1, Feb. 9, 1992, pp. 166–173, XP002057023.

Lynch R. T: "Channels and Codes for Magnetooptical Recording" IEEE Journal on Selected Areas in Communications, vol. 10, No. 1, Jan. 1992, pp. 57–72, XP00462065.

* cited by examiner

Primary Examiner—Nabil Hindi
(74) Attorney, Agent, or Firm—Frommer Lawrence & Haug, LLP; William S. Frommer; Dennis M. Smid

(57) ABSTRACT

An optical information reproducing method for demodulating the information recorded on a recording medium by a viterbi decoding method, in which data can be demodulated with high accuracy even if the recording power has undergone variations at the time of recording the information. Data recorded on the recording medium after modulation in which the minimum length between transitions is limited to not less than 2 is decoded using the viterbi decoding method. A specified signal recorded on the recording medium is used for setting the reference value used for viterbi decoding.

3 Claims, 7 Drawing Sheets

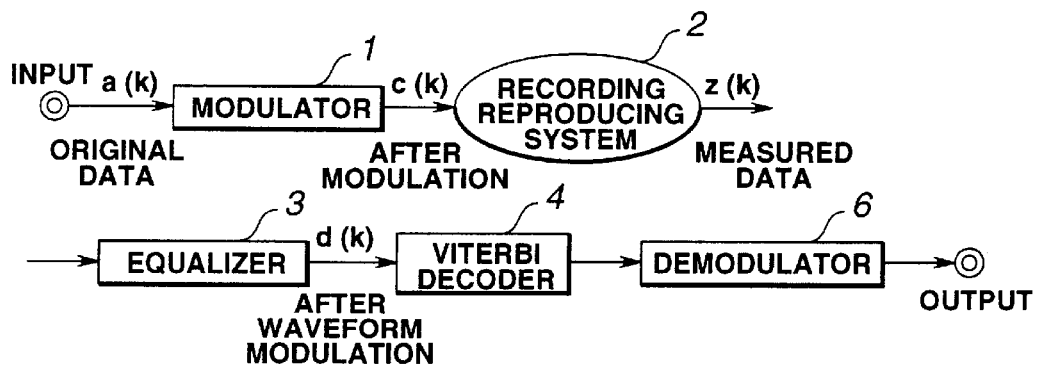

| CURRENT STATE | NEXT STATE | | OUTPUT | |
|---|---|---|---|---|
| | 0 | 1 | 0 | 1 |
| S0 (0,0) | S0 | S1 | 0 | 1 |
| S1 (0,1) | — | S3 | — | 3 |
| S2 (1,0) | S0 | — | 1 | — |
| S3 (1,1) | S2 | S3 | 3 | 4 |

NEXT IMPUT $c(k) / d(k)$
$c(k)$ : INPUT DATA
$d(k)$ : OUTPUT DATA

STATUS TRANSITION (1)　STATUS TRANSITION (2)　STATUS TRANSITION (3)　STATUS TRANSITION (4)

FIG. 8A    FIG. 8B    FIG. 8C
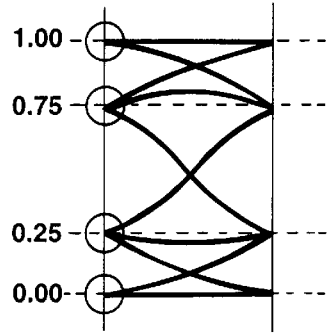
NO ASYMMETRY;
IDEAL EQALIZATION
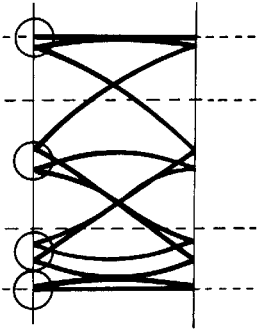
INSUFFICIENT
POWER
AT TIME OF
RECORDING;
INSUFFICIENT
WAVEFORM
EQUALIZATION
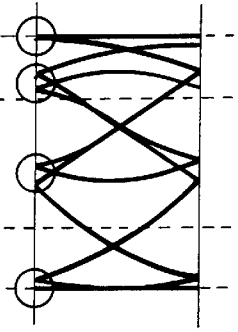
OVER-POWER
AT TIME OF
RECORDING;
INSUFFICIENT
WAVEFORM
EQUALIZATION
FIG. 9

USING PATTERN HAVING STURATION AMPLITUDE

USING RE-SINK SIGNAL

USING RE-SINK SIGNAL
USING SHORTEST PERIOD
REPETITION SIGNAL

OPTICAL INFORMATION REPRODUCING METHOD AND APPARATUS

BACKGROUND OF THE INVENTION

1. Field of the Invention

This invention relates to an optical information reproducing method and apparatus for demodulating the information recorded on a recording medium using a viterbi decoding method.

2. Description of Related Art

In the field of information recording, researches into a system of optically recording/reproducing information signals are proceeding these years. The system of optically recording/reproducing information signals have many assets that recording/reproduction is feasible in a non-contact fashion, the recording density about one digit of magnitude higher than is possible with the magnetic recording system can be realized and that a variety of memory configurations, such as read-only, write-once or overwrite type memories can be coped with. Thus, the optical recording/reproducing system is finding application in many usages ranging from industrial to domestic usages.

Specifically, an optical disc, such as a digital audio disc or an optical video disc having the music information recorded thereon, has become popular as a read-only recording medium. On the other hand, a magneto-optical disc or a phase-transition type optical disc is in widespread use as an overwrite type optical disc.

For high-density recording of these recording mediums, there are proposed a variety of methods, one of which is a method of realizing high density by using techniques in connection with the signal processing system. Among these approaches, there is known such a technique in which the transmission characteristics of playback signals when reading out the information recorded on the recording medium to a high density are deemed to be partial response (PR) characteristics and the viterbi decoding method is applied for compensating S/N deterioration. The demodulation by the viterbi decoding method selects the most probable data sequence using the information on the status of transition of the playback signals (RF signals) for performing the demodulation and is said to have the decoding capability higher than the sequential decoding which gives judgment from on bit to another.

In a magneto-optical disc, for example, a system combined from the magnetic field modulation system with the PR(1,1) and the viterbi decoding method for realizing a high recording density has been formulated as a HS standard for the magneto-optical disc 3.5 inches in diameter.

Up to now, a low-pass type PR(1,1) system has mainly been adopted as PR characteristics for application of the viterbi decoding as in the above-mentioned HS standard. However, it has been reported that, in optically reproducing the information signals, the PR(1,2,1) characterized by more extensive high-range attenuation than the PR(1,1) can realize transmission characteristics of the read-out optical system closer to those for reproducing the information recorded to high density and hence is more desirable.

The status transition for PR(1,2,1) is now explained.

In a block diagram of FIG. 1, there is shown a transmission route for recording/reproducing the information. In FIG. 1, k, a(k), c(k), z(k) and d(k) denotes time (operating clocks), original data recorded on a recording medium, modulated data directly before recording on the recording medium, noise-corrupted data read out from the recording medium and data following waveform equalization, respectively.

For data recording, the data a(k) is entered and modulated by a modulator 1 into modulated data c(k) which is recorded by a recording/reproducing system 2 on a recording medium. For reproducing the data recorded on the recording medium, the data is read out by a recording/reproducing system 2, such that the noise-containing data z(k) reproduced by the recording/reproducing system 2 is outputted by the recording/reproducing system so as to be waveform-equalized by an equalizer 3. The waveform-equalized data is decoded by a viterbi decoder 4 to enter a demodulator 6 for being outputted as demodulated data.

If k−1 and k−2 denote time preceding time k by one clock and time preceding the time k by two clocks, respectively, and d(k) has transmission characteristics of the waveform PR(1,2,1), the inter-symbol interference is given by the following equation (1):

$$d(k)=c(k)+2c(k-1)+c(k-2) \qquad (1)$$

That is, with the PR(1,2,1) characteristics, the three-clock input information has pertinence to output data at a given time point.

In connection with the PR(1,2,1) characteristics, FIGS. 2 and 3 show a table summarizing the relation between input data and output data and the status transmission diagram, respectively. Here, the statuses are represented by the arraying of the input information and are specified by $Sx(c(k-2), c(k-1), c(k))$, where x is a postscript specifying respective status and the value itself has no particular meaning. On the other hand, c(k) is 0 or 1 because the signal is a digital signal.

With the PR(1,2,1) characteristics, an output can assume five values, while eight statuses can exist, as shown in FIGS. 2 and 3. If 1 is entered next to the status S3(0,1,1), the status transfers to S7(1,1,1), with the output being 4.

However, the viterbi decoder for 5 values and 8 statuses is highly complex in structure and gigantic in circuit scale. Thus, for a modulation system for recording the information on a recording medium, it is customary to use the viterbi decoder in combination with a modulation system in which the minimum length between transitions is limited to 2. The modulation system in which the minimum length between transitions is limited to 2 may be typified by a system consisting in the (1,7) RLL code combined with the NRZI system. Under this limitation, there is a run of at least two 0s or 1s in the modulated input data, while the statuses of S2(0,1,0) or S5(1,0,1) cannot exist.

If FIGS. 2 and 3 are again put into order, all statuses can be described with the constraint status of two clocks, FIGS. 4 and 5 show the status represented as $Sx(c(k-1), c(k))$ and again put into order. It is seen from FIGS. 4 and 5 that the output has four values and the status that can be taken are four states, namely S0, S1, S2 and S3. This status transition is similar to that for PR(1,1). This enables the scale of the actual decoding circuit to be reduced significantly.

However, actual RF signals are corrupted with significant errors such that the output level on reproduction is not necessarily coincident with the above-described ideal value. The ideal output level, that is the reference signal level used for comparison with the actual signal level, is herein termed a reference value used for viterbi decoding. If the amplitudes of the reproduced RF signals in their entirety are normalized by 1, the four reference values are usually 0.00/0.25/0.75/1.0, in association with the statuses S1/S2/S3/S4, respectively.

If data can be recorded with a recording power that is optimum for a recording medium, the capability of the viterbi decoding can be exploited fully by performing waveform equalization so that the RF signals will have the transmission characteristics of PR(1,2,1). However, if the information recording power is deviated from its optimum value, asymmetry is introduced into the RF signal. This asymmetry is outstanding with the use of the optical modulation recording system. If the asymmetry is produced, the RF signal level, which should inherently be converged to the 0.25/0.75 level, is deviated upwards or downwards even on waveform equalization. If the 0.00/0.25/0.75/1.0 combination is applied in this state as the reference value used for viterbi decoding, there is produced an error despite the use of the viterbi decoding, thus significantly lowering the decoding capability.

SUMMARY OF THE INVENTION

It is therefore an object of the present invention to provide an optical information reproducing method and apparatus in which, if the recording power is subjected to fluctuations during information recording, the most probable data string can be selected and demodulated based on the information on the transition status obtained from the reproduced RF signals.

For accomplishing the above object, it suffices if the playback signal from the information recorded on the recording medium and the contents and the position of which are previously known is used for dynamically setting the reference value used for viterbi decoding.

In one aspect, the present invention provides a optical information reproducing method for demodulating data recorded on a recording medium by viterbi decoding, after modulation having the minimum length between transitions limited to 2 or more, including setting a reference value used for viterbi decoding by exploiting a specified signal recorded on a recording medium.

Specifically, the reference pattern can be appended to the header part each sector and used as the specified signal. For example, a pattern which gives the saturation amplitude at the time of the information reproduction can be used as the above-mentioned reference pattern.

Alternatively, the synchronization signal appended to a data string at the time of recording the information, or the recurrent signal of the shortest period recorded in a header part of each sector, may be used as the specified signal.

With the optical information reproducing method according to the present invention, since the specified signal recorded on the recording medium is used for setting the reference value used for viterbi decoding, an optimum reference value in meeting with the playback signal level can be used for viterbi decoding, thus enabling accurate data demodulation.

In another aspect, the present invention provides an optical information reproducing device including a reference value setting circuit for setting a reference value used for viterbi decoding, based on a playback signal level of the information recorded at a pre-set position on a recording medium, and a viterbi decoding circuit for performing viterbi decoding using a reference value set by the reference value setting circuit.

With the above-described optical information reproducing device, the reference value used for viterbi decoding is set by the reference value setting circuit, based on the playback signal level. The viterbi decoding circuit performs viterbi decoding using the reference value set by the reference value setting circuit. That is, with the present optical information reproducing device, the reference value used for viterbi decoding is dynamically set depending on the playback signal level. Thus, with the present optical information reproducing device, an optimum reference value depending on the playback signal level can be used for viterbi decoding, thus enabling accurate data demodulation.

BRIEF DESCRIPTION OF THE DRAWINGS

FIG. 1 is a block diagram showing a data transmission route of an information recording/reproducing system.

FIG. 2 shows the relation between input data and output data of 5-value 8-status PR(1,2,1) characteristics.

FIG. 8 shows the manner of asymmetry for an eye-pattern of playback signals.

FIG. 9 shows a typical playback signal.

DESCRIPTION OF PREFERRED EMBODIMENTS

Figures 3, 4:
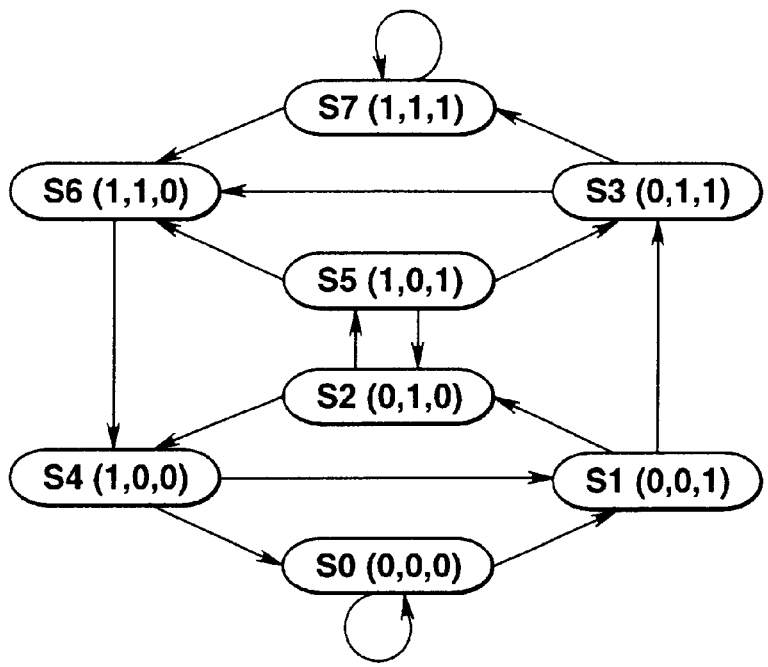
FIG. 3 is a status transition diagram showing the relation between input data and output data of 5-value 8-status PR(1,2,1) characteristics.
FIG. 4 shows the relation between input data and output data of 4-value 4-status PR(1,2,1) characteristics in which the minimum length between transitions is limited to 2.
Figure 5:
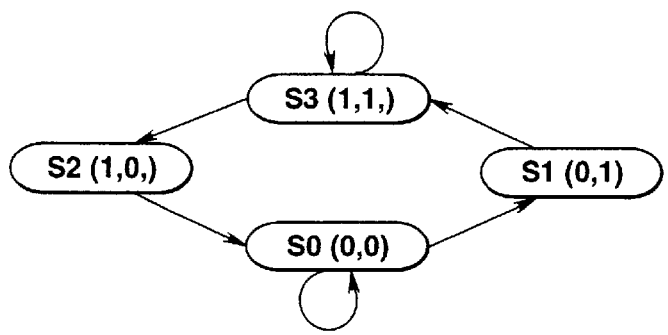
FIG. 5 is a status transition diagram showing the relation between input data and output data of 4-value 4-status PR(1,2,1) characteristics in which the minimum length between transitions is limited to 2.

Referring to the drawings, preferred embodiments of a digital signal transmission device according to the present invention will be explained in detail.

First, the 4-value 4-status viterbi decoding method embodying the invention will be explained.

In viterbi decoding, the plausibility of transition from a given state to the next state is calculated and a route with the maximum probability of status transition is found for carrying out the decoding. In viterbi decoding, the route of status transition is usually termed a path and the plausibility through a given status is termed a metric.

In the following calculations, the metric representing the plausibility at a status $S_x$ at a time point k is described as $L(S_x, k)$ as a path metric and square errors between measured value $z(k)$ and the reference value are summed together. The path having the smallest path metric is the most plausible data. There is also a calculating method consisting in calculating the maximum likelihood. This method is essentially the same as the present method.

In the following description, the reference value for decoding is normalized as having the maximum amplitude equal to 1. That is, the minimum level corresponding to S0 is set to 0.0, while the maximum level corresponding to S2 is set to 1.0. Also, the levels corresponding to S1 and S2 are represented as A and B, respectively.

Figure 6:
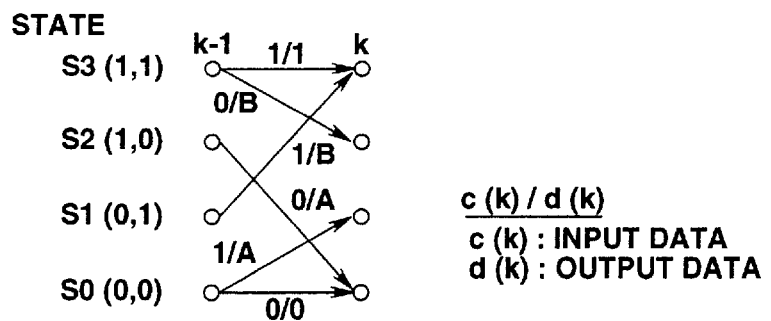
FIG. 6 is a trellis diagram showing the manner of status transition.

FIG. 6 shows a trellis diagram showing the manner of status transitions at this time. The metric is as shown in the following equations (2) through (4). In the following equations, min(a,b) denotes that a or b, whichever is smaller, is selected.

$$L(S0,k)=\min\{L(S0,k-1)+z(k)^2, L(S2, k-1)+(A-z(k))^2\} \quad (2)$$

$$L(S1, k)=L(S0, k-1)+(A-z(k))^2 \quad (3)$$

$$L(S2, k)=L(S3, k-1)+(B-z(k))^2 \quad (4)$$

$$L(S3, k)=\min\{L(S0, k-1)+(B-z(k))^2, L(S2, k-1)+(1-z(k))^2\} \quad (5)$$

The above equation (2) means that both S0 and S2 are possible as the status prior to transition to S0 and that, S0 or S2 having a smaller value of the sum of the metrics accumulated so far and the square of the difference between the measured value and the reference value is left as more probable metric. The equation (3) means that the status prior to transition to S1 is S0 and that the sum of the metrics accumulated so far and the squared difference between the measured value and the reference value is used as a new metric. The equation (4) means that the status prior to transition to S2 is S3 and that the sum of the metrics accumulated so far and the squared difference between the measured value and the reference value is used as a new metric. The above equation (5) means that both S0 and S2 are possible as the status prior to transition to S3 and that, S0 or S2 having a smaller value of the sum of the metrics accumulated so far and the square of the difference between the measured value and the reference value is left as more probable metric.

If the above equations (2) to (5) are directly designed as circuits, the presence of the term of the square of the measured value z(k) impairs the processing speed. Therefore, normalized metrics shown by the following equation (6) are defined and the above equations (2) to (5) are rewritten to the equations (7) to (10), respectively.

$$m(Sx, k)=\{L(Sx, k)-z(k)^2\}/2 \quad (6)$$

$$m(S), k)=\min\{m(S0, k-1), (S2, k-1)+A^2/2-A\times z(k)\} \quad (7)$$

$$m(S1, k)=m(S0, k-1)+A^2/2-A\times z(k) \quad (8)$$

$$m(S2, k)=m(S3, k-1)+B^2/2-B\times z(k) \quad (9)$$

$$m(S3, k)=\min\{m(S1, k-1)+B^2/2-B\times z(k), m(S3, k-1)+\tfrac{1}{2}-z(k)\} \quad (10)$$

Based on the relative magnitude of two terms of the above equations (7) and (10), the following four possible status transitions may be thought of as possible status transitions:

$$m(S0, k-1) \leq m(S2, k-1)+A^2/2-A\times z(k)$$

and $$m(S1, k-1)+B2/2-B^*z(k)<m(S3, k-1)+\tfrac{1}{2}-z(k) \quad \text{status transition (1)}$$

$$m(S0, k-1)>m(S2, k-1)+A^2/2-A\times z(k)$$

and $$m(S1, k-1)+B2/2-B^*z(k)<m(S3, k-1)+\tfrac{1}{2}-z(k) \quad \text{status transition (2)}$$

$$m(S0, k-1) \leq m(S2, k-1)+A^2/2-A\times z(k)$$

and $$m(S1, k-1)+B2/2-B^*z(k) \geq m(S3, k-1)+\tfrac{1}{2}-z(k) \quad \text{status transition (3)}$$

$$m(S0, k-1)>m(S2, k-1)+A^2/2-A\times z(k)$$

and $$m(S1, k-1)+B2/2-B^*z(k) \geq m(S3, k-1)+\tfrac{1}{2}-z(k) \quad \text{status transition (4)}$$

Figure 7:
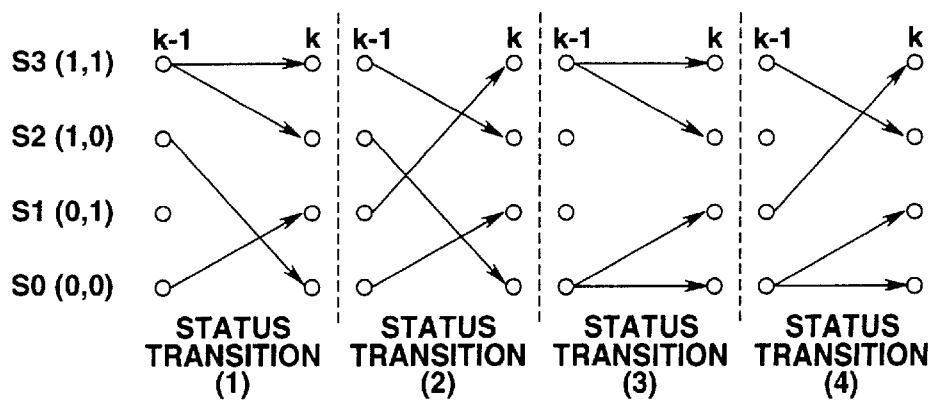
FIG. 7 is a trellis diagram showing the possible combinations of status transitions.

The manner of status transitions (1) to (4) as described above is summarized in FIG. 7. If the information concerning the status transitions is stored in a register and traced back retrogressively, only one path after all survives as the most plausible route. The data on this surviving path is demodulated as being correct data. This sequence of operations represents the 4-value 4-status viterbi decoding.

The problem actually encountered when applying the above-described viterbi decoding to playback signals from a recording medium, and the technique of the present invention which has dissolved the problem, are specifically explained.

FIG. 8 shows an example of an eye-pattern representing the playback signals. FIG. 8A shows an example in which the power during recording is proper and waveform equalization to PR(1,2,1) has been done correctly, while FIGS. 8B and 8C show an example in which the power during recording is insufficient and waveform equalization to the PR(1, 2,1) has not been done sufficiently and an example in which the power during recording is too strong to realize waveform equalization to the PR(1,2,1) satisfactorily.

If the power during recording of the information signals on the recording medium is optimum and moreover the waveform equalization to PR(1,2,1) has been done satisfactorily, it suffices to set the reference value for viterbi decoding to 0.00/0.25/0.75/1.00 in association with the statuses S1/S2/S3/S4, respectively.

However, if asymmetry is produced, the converging positions of the statues S1 and S2 are deviated from ideal values at data identification points for playback signal waveform, as may be seen from the eye-pattern shown in FIGS. 8B or 8C. If a value corresponding to the ideal states is directly used in such case, the decoding capability is lowered significantly.

Meanwhile, if 0<A<B<1, the equation of the principle of viterbi decoding as described above is not disrupted even although values other than 0.25 and 0.75 are substituted into the variables A and B. That is, the reference value corresponding to the status S1 may be other than 0.25, while the reference value corresponding to the status S2 may be other than 0.75.

Thus, according to the present invention, a value of a level where the actual signal is concentrated is used as the reference value for viterbi decoding, instead of directly using a value corresponding to the ideal state. By so doing, a proper reference value can be set even if the playback signal is deviated from the ideal equalized state of PR(1,2,1) thus fully exploiting the capability of viterbi decoding.

An illustrative example of the playback signal is shown in FIG. 9 showing that a pattern P1 having a saturation amplitude, a signal P2 recurrent at the shortest period and a random signal P3 are outputted sequentially.

At this time, the level corresponding to the status S3 and the level corresponding to the status S0 can be determined relatively easily by detecting the maximum and minimum values of the payback signal level. On the other hand, the level corresponding to the status S1 and the level corresponding to the status S2 can be determined on the basis of the shoulder portion of a waveform having a saturation amplitude or the upper and lower levels of the recurrent signal having the shortest period.

That is, since the levels corresponding to the statuses S1 and S2 are those when the recording data is switched from 0 to 1 or from 1 to 0, these levels can be detected relatively easily if it is known which information is recorded in which portion on the recording medium.

Thus, according to the present invention, the level corresponding to the status S1 or status S2 is not set to a pre-set value, but is determined dynamically depending on the playback signals. The above-described viterbi decoding is executed on the basis of these dynamically set reference values.

An example of using a pattern according a saturation amplitude, an example of using a synchronization signal and an example of using the recurrent signal of the shortest period are hereinafter explained as specified examples of setting the reference values corresponding to the statuses S1 and S2 on the basis of the playback signals.

Using a Pattern According a Saturation Amplitude

If waveform equalization is insufficient due to asymmetry, the level corresponding to the status S1 and S2 obtained from the signal having a saturation amplitude is not coincident with the level obtained from the recurrent signal having the shortest period, but a difference is produced therebetween. The pattern which affords the saturation amplitude on reproduction is higher in probability of occurrence than a pattern which gives an unsaturated amplitude. For example, in a modulation system combined from the (1,7) RLL codes and the NRZI system, the information is recorded by the combination of seven information units of 2 T to 8 T. In this case, the information unit of a length roughly exceeding 4 T exhibits a saturation amplitude. On the other hand, the information unit exceeding a length of 4 T exhibits a saturation amplitude on reproduction, depending on the line density at the time of recording.

In this case, it is sufficient if a pattern which gives a saturation amplitude is recorded as a test pattern is appended to a header from sector to sector before recording information signals and, during data reproduction, and reference values corresponding to the statuses S1 and S2 are set on the basis of the level of the playback signals obtained from the test pattern.

Using Synchronization Signal

When recording information signals, a synchronization signal is usually appended for improving demodulation reliability at the time of information reproduction. For this synchronization signal, a long information unit is frequently used. It is therefore possible to set the reference value used for viterbi decoding using this synchronization signal.

Figure 10A:
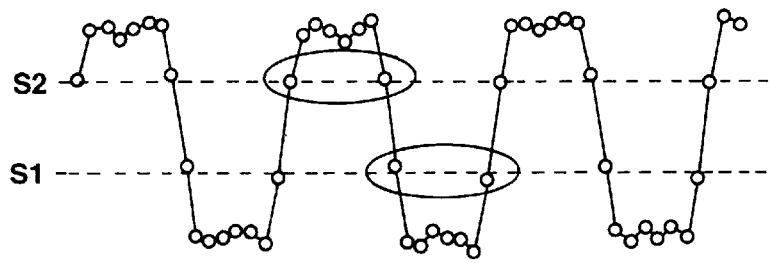
FIG. 10 shows an example of a signal usable as a pattern for determining the reference value used for viterbi decoding.
Figure 10B:
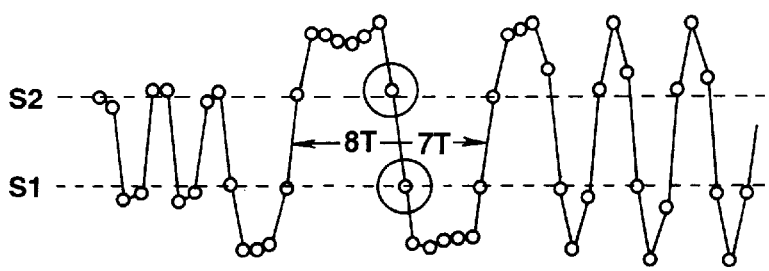
Figure 10C:
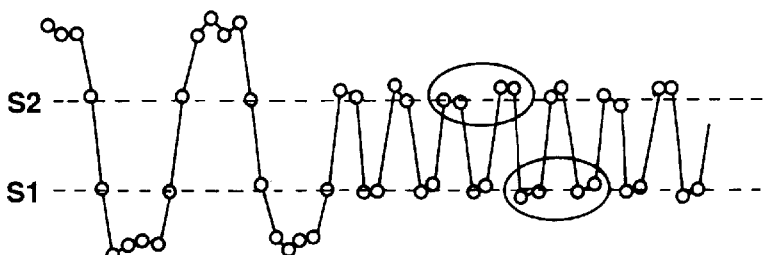

For example, the ISO/IEC 13549 standard provides that 2-byte synchronization signal shall be appended per 20 bytes of the pre-modulation input signal prior to modulation. This synchronization signal necessarily contains a 8 T/7 T information unit set, as shown in FIG. 10B. Thus, for reproducing data, the reference values corresponding to the statuses S1 and S2 are set on the basis of the level of the playback signal obtained from the synchronization signal.

If the synchronization signal is used in this manner, the reference value used for viterbi decoding can be dynamically set using only the pre-existing data pattern, without newly adding a test pattern.

Using the Recurrent Signal With Shortest Period

If waveform equalization is sufficient such that the level of the recurrent signal with the shortest period (VFO signal) is substantially coincident with the level corresponding to the statuses S1 and S2 obtained from the signal having the saturation amplitude, the reference value corresponding to the statuses S1 and S2 can be set based on the header part signal.

For example, the ISO standard for a magneto-optical disc provides an area for recording VFO signal for producing clocks for PLL for information reproduction in a header part of each sector.

Figure 11:
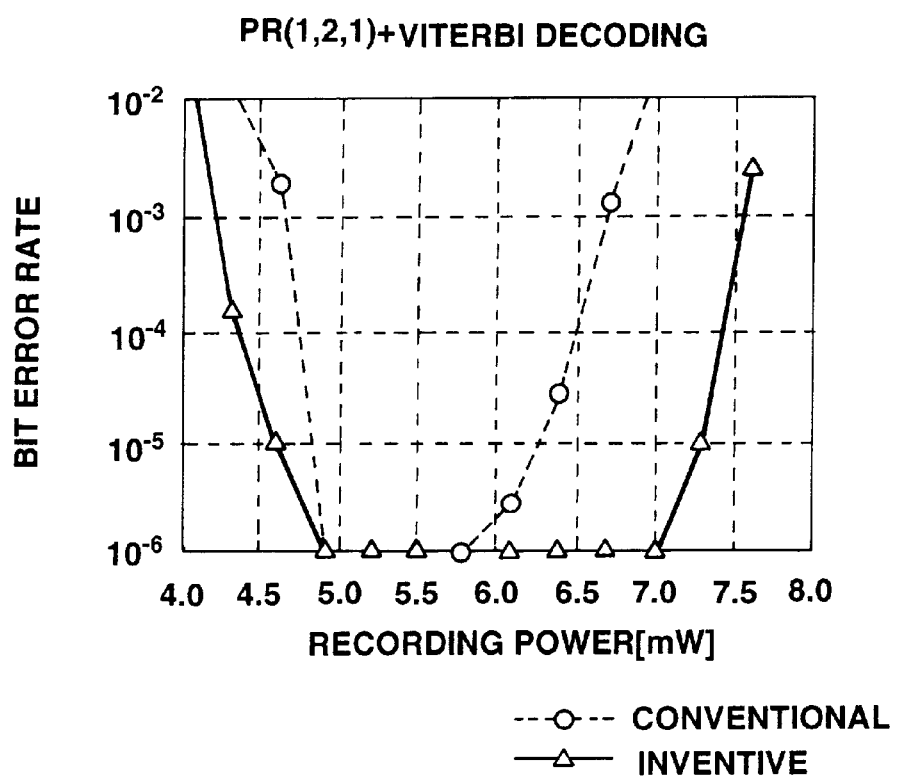
FIG. 11 is a graph showing the decoding capability of the optical information decoding system of the present invention as compared to the conventional optical information decoding system.

FIG. 11 shows the results of comparative experiments on the decoding capability for a case in which the reference value used from viterbi decoding is dynamically set based on the playback signal level and that for a case in which the reference value used for viterbi decoding is fixed for decoding. In FIG. 1, the abscissa denotes the power of the laser light used for recording the information signals, while the ordinate denotes the bit error rate in which the information signals are decoded using viterbi decoding. Also, in FIG. 11, Δ and ○ denote a case of dynamically setting the reference value used for viterbi decoding according to the present invention and a case of fixedly setting the reference value used for viterbi decoding, respectively.

The present experiment revealed that the recording power in the vicinity of 5.5 mW represents an optimum value not producing asymmetry. The ascendancy of the decoding method exploiting the present invention becomes apparent especially on the high power side, as shown in FIG. 11. Specifically, approximately 80% improvement can be expected in terms of the power margin with the error rate of $10^{-5}$ as reference. FIG. 11 shows data in case recording is done on a magneto-optical disc by light modulation. However, the present invention can, of course, be applied to a phase transition type optical disc or a read-only optical disc.

Figure 12:
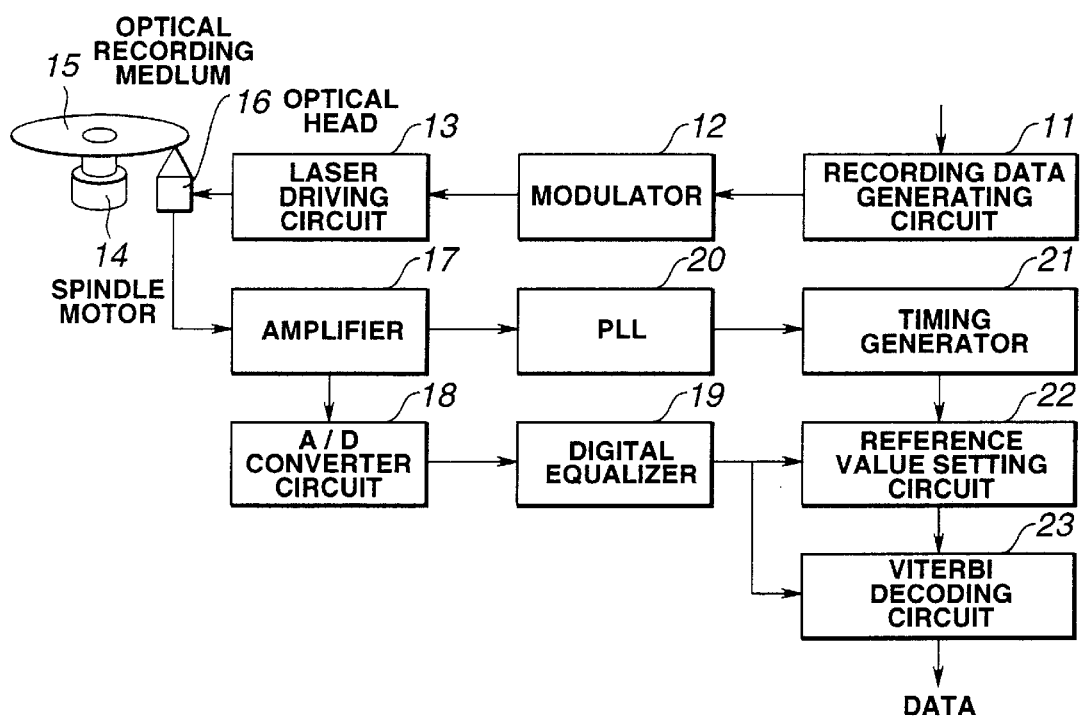
FIG. 12 is a block diagram showing a typical structure of an optical information decoding apparatus embodying the invention.

An illustrative example of an optical information reproducing device employing the above-described reproducing method is explained by referring to FIG. 12 showing the structure of the optical information reproducing device.

When recording information signals, input data from outside are entered to a recording data generating circuit 11 of the present optical information reproducing device. The recording data generating circuit 11 generates recording data for recording on a recording medium based on the input data. The recording data is entered to a modulation circuit 12 which then modulates the recording data in a pre-set manner. If desired to add a test pattern for setting the reference value used for viterbi decoding to the recording data, it is added by the recording data generating circuit 11 or by the modulation circuit 12. The signal modulated by the modulation circuit 12 is supplied to a laser driving circuit 13. The laser driving circuit 13 runs the optical head 16 in rotation for writing the signal on a optical recording medium 15 as it runs the recording medium 15 in rotation by a spindle motor 14.

When reproducing the signals written as described above, the optical head 16 is run, as the optical recording medium 15 is rotated by the spindle motor 14, for reproducing the signals written on the optical recording medium 15. The reproduced signals from the optical head 16 are entered to and amplified by an amplifier 17 before being entered to an A/D converter circuit 18. The playback signals entering the A/D converter circuit 18 is thereby converted into digital signals which are then entered to a digital equalizer 19 for waveform equalization. The signals amplified by the amplifier 17 are also entered to a PLL circuit 20 for extracting the clock information which is then entered to a timing generator 21 for synchronization for reproduction.

The optical information signals reproducing device employing the present invention includes a reference value setting circuit 22 for setting the reference value used for viterbi decoding. This reference value setting circuit 22 sets a reference value used for viterbi decoding, based on the clock signals from the timing generator 21 and the signal from the digital equalizer 19 and routes the reference value to a viterbi decoding circuit 23. Specifically, the reference value setting circuit 22 counts the clock signals supplied from the timing generator 21 for detecting the playback signal level at a pre-set test pattern generating point to supply the information to the viterbi decoding circuit 23.

The reference value set by the reference value setting circuit 22 and the signal waveform-equalized by the digital equalizer 19 are entered to the viterbi decoding circuit 23. Using the reference value set by the reference value setting circuit 22, the viterbi decoding circuit 23 viterbi-decodes the signals waveform-equalized by the digital equalizer 19 to output viterbi-decoded data as playback data.

By detecting and holding the necessary signal level from the playback information of the information the recording position and contents of which are pre-set by the reference value setting circuit 22, and by supplying the signal level to the viterbi decoding circuit 23, viterbi decoding can be realized in stability even incases wherein asymmetry is preset in the playback signals.

What is claimed is:

1. An optical information reproducing method comprising the steps of:

setting an upper reference value and a lower reference value;

detecting a specified signal recorded at a predetermined position of a signal on a recording medium in which the specified signal is one of a reference pattern appended to a header part of a sector, a synchronization signal appended to a data string at the time of recording, and a recurrent signal of the shortest period recorded on a header part of a sector;

setting dynamically first and second reference values in between said upper and lower reference values in which each of said first and second reference values is set respectively in accordance with a level of said specified signal; and performing viterbi decoding using said upper reference value, said first and second reference values, and said lower reference value.

2. The optical information reproducing method as claimed in claim 1 wherein a pattern which gives a saturation amplitude at the time of information reproduction is used as said reference pattern.

3. An optical information reproducing device comprising:

a reference value setting circuit for detecting a specified signal recorded at a predetermined position of a signal on a recording medium and for setting an upper reference value and a lower reference value and for dynamically setting first and second reference values in between said upper and lower reference values in which each of said first and second reference values is set respectively in accordance with a level of said specified signal; and a viterbi decoding circuit for performing viterbi decoding using said upper reference value, said first and second reference values, and said lower reference value, in which the specified signal is one of a reference pattern appended to a header part of a sector, a synchronization signal appended to a data string at the time of recording, and a recurrent signal of the shortest period recorded on a header part of a sector.

* * * * *